(12) United States Patent
Yang et al.

(10) Patent No.: US 6,468,869 B1
(45) Date of Patent: Oct. 22, 2002

(54) METHOD OF FABRICATING MASK READ ONLY MEMORY

(75) Inventors: Chun-Yi Yang, Chu-Tong (TW); Chun-Jung Lin, Hsinchu (TW); Ful-Long Ni, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/930,843

(22) Filed: Aug. 14, 2001

(30) Foreign Application Priority Data

May 11, 2001 (TW) ........................................ 90111227 A

(51) Int. Cl.[7] .......................................... H01L 21/8236
(52) U.S. Cl. ........................ 438/278; 438/275; 438/276; 438/277
(58) Field of Search ................................. 438/276, 275, 438/277, 278

(56) References Cited

U.S. PATENT DOCUMENTS 5,278,078 A * 1/1994 Kanebako et al.
5,407,852 A * 4/1995 Ghio et al.
6,030,871 A * 2/2000 Eitan
6,133,101 A * 10/2000 Wu

* cited by examiner

Primary Examiner—Long Pham
(74) Attorney, Agent, or Firm—J.C. Patents

(57) ABSTRACT

A method of fabricating a mask read only memory. Gate stacked structures, each of which made up of a gate dielectric layer, a gate conductive layer and a gate cap layer, are formed on a substrate. Source/drain regions are between, but not adjacent to the gate stacked structures. Regions between the source/drain regions and the gate stacked structures are coding areas. A dielectric layer is formed to fill spaces between the gate stacked structures. A photoresist layer with openings exposing the first dielectric layer on the coding areas is formed. The exposed first dielectric layer is removed to form implantation openings of the coding areas. Ion implantation is performed on the exposed coding areas. The photoresist layer is removed, and another dielectric layer is formed to fill the implantation openings. An etching back process is performed to expose the gate conductive layer. A word line is formed on the gate conductive layer.

27 Claims, 7 Drawing Sheets

METHOD OF FABRICATING MASK READ ONLY MEMORY

CROSS-REFERENCE TO RELATED APPLICATION

This application claims the priority benefit of Taiwan application serial no. 90111227, filed May 11, 2001.

BACKGROUND OF THE INVENTION

1. Field of the Invention

The invention relates in general to a method of fabricating a mask read only memory (ROM). More particularly, the invention relates to a method of fabricating a mask read only memory used to store two bits in one memory unit in programming.

2. Description of the Related Art

Due to the non-volatile property that avoids memory loss by power interruption, many electric products require read only memories to maintain normal operation between on and off. That mask read only memory is one of the basic read only memories. The commonly used mask read only memory uses a channel transistor as a memory cell. An ion implantation step is performed on the selected channels in programming, and the on or off state of the memory cell is controlled by changing the threshold voltage. In the structure of the mask read only memory, the polysilicon word line (WL) is formed across the bit line (BL). The channel regions of the memory cells are formed under the word line between the bit line. Whether the channel is implanted with ions determines which of the two-bit data "0" and "1" is stored. The step of implanting ions into the selected channel regions is called the "code implantation process".

FIG. 1 shows a top view of a conventional mask read only memory. In FIG. 1, the parallel bit lines 102 run across the parallel bit lines 104. The ion implantation block 110 of the substrate, that is, the channel region of the memory cell, is implanted with ions for programming. The threshold voltage is thus altered to achieve the objective of controlling on/off of the memory cell.

FIG. 2 shows a cross-sectional view of the conventional mask read only memory. A plurality of gate stacked structures 206, each of which comprises a gate dielectric layer 202 and a gate conductive layer 204, is formed on a substrate 200. A source/drain region 208 is formed in the substrate 200 between the gate stacked structures 206. A dielectric layer 210 is formed to cover the gate stacked structures 206. While performing the implantation coding process, a patterned photoresist layer 212 is formed using a photomask to expose the region to be coded. An ion implantation 214 is then performed using the photoresist layer 212 as a mask. Boron ions are implanted into the substrate 200 at a bottom of the coding area under the stacked gate structures 206 to perform programming, so that the program is coded in the read only memory.

During the ion implantation step for programming, boron ions are implanted into the substrate 200 by penetrating through the gate stacked structure 206. A large implantation energy is thus required. Using a large energy to implant boron ions requires a large thermal budget for the device. It is thus easy to cause ion scattering or diffusion towards other positions of the substrate which interferes with control of the device. As the integration of integrated circuit increases, and the production of the mask read only memory has reached the sub-micron process, the dimension of devices decreases. Consequently, interference with control is more significant.

SUMMARY OF THE INVENTION

The invention provides a method of fabricating a mask read only memory to store a two bit data in one memory unit with an increased integration. Without increasing the number of photomasks, the mask read only memory is fabricated with a higher density.

The method of fabricating a mask read only memory provided by the invention also resolves the interference problem, caused by ion scattering and diffusion in the substrate, by using a reduced implantation energy.

In the above method of fabricating a mask read only memory, a plurality of gate stacked structures, each of which comprises a gate dielectric layer, a gate conductive layer and a gate cap layer, is formed on a substrate. A plurality of source/drain regions is formed in the substrate between the gate stacked structures, while the source/drain regions are not adjacent thereto. Regions of the substrate between the source/drain regions and the gate stacked structures are defined as the coding areas. A first dielectric layer is formed to fill spaces between the gate stacked structures. A photoresist layer with a plurality openings exposing the first dielectric layer on the coding areas is formed. Using the photoresist layer as a mask, the exposed first dielectric layer is removed to form a plurality of implantation openings of the coding areas. An ion implantation step is performed on the exposed coding areas to form a plurality coding implanted blocks. The photoresist layer is removed, and a second dielectric layer is formed to fill the implantation openings. An etching back process is performed to expose the gate conductive layer. A word line is formed on the gate conductive layer.

In the above methods, spacers are formed on sidewalls of the gate stacked structures, such that small channels are formed in the substrate between the source/drain regions and the gate conductive layers. Different forms of dopants are then used to connect or cut off the small channels for data loading. Thus, two bits of data can be stored in one memory cell to enhance the integration. The same number of photomasks is used to fabricate a mask read only memory with an increased density.

In addition, one conductive layer may also be formed on the source/drain regions to reduce the resistance of the source/drain regions, so as to improve the device performance.

In the coding implantation step, the ions are implanted into the substrate between gate conductive layers and the source/drain regions directly, so that the implantation energy is reduced. The interference problems caused by ions scattering and diffusion problems occurring to the conventional method can thus be resolved.

Both the foregoing general description and the following detailed description are exemplary and explanatory only and are not restrictive of the invention, as claimed.

DESCRIPTION OF THE PREFERRED EMBODIMENTS

First Embodiment

Figure 1:
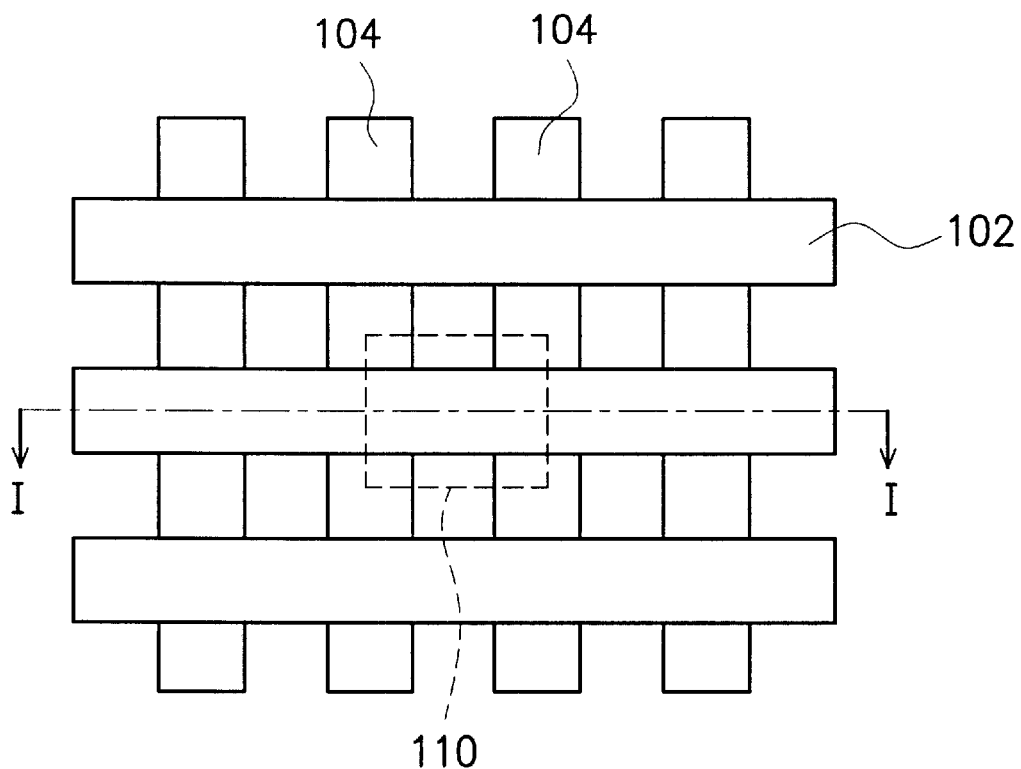
FIG. 1 is a top view showing a conventional mask read only memory.
Figure 2:
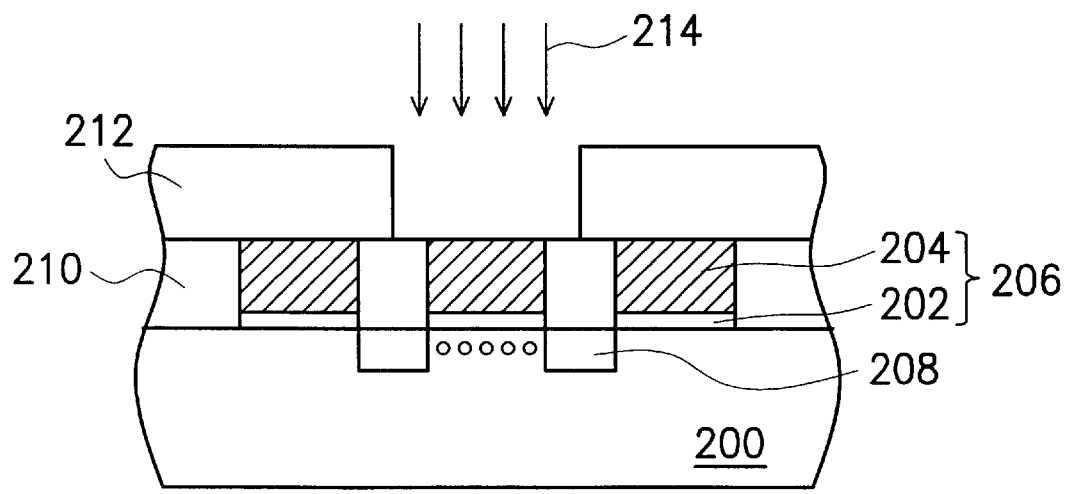
FIG. 2 is a cross-sectional view of a conventional mask read only memory.

FIG. 3A to FIG. 3F are cross-sectional views showing a first embodiment of the method for fabricating a mask read only memory according to the invention. The cross-sectional views are taken along the cutting line I—I as shown in FIG. 1, while the mask read only memory fabricated according to the invention has a top view similar to FIG. 1.

Figure 3A:
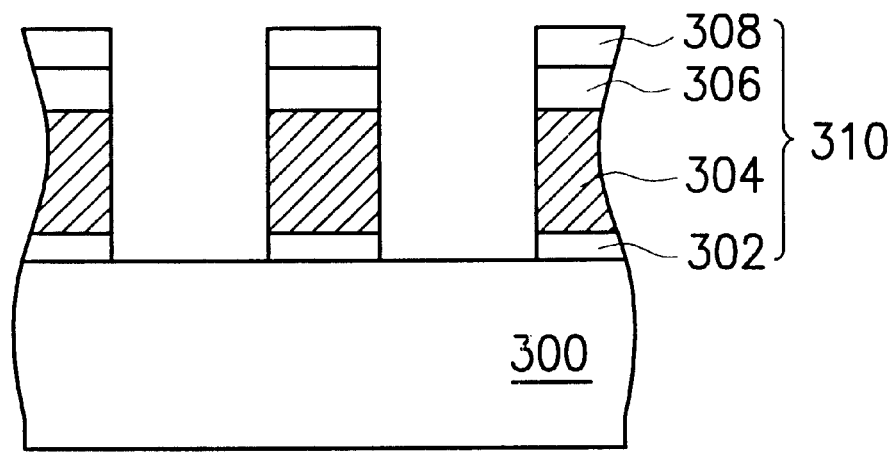
FIG. 3A to FIG. 3F are cross-sectional views along the cutting line I—I as shown in FIG. 1 to illustrate the fabrication process of a mask read only memory according to the invention.

In FIG. 3A, a substrate 300 is provided. A gate dielectric layer 302, a gate conductive layer 304, a gate cap layer 306 and a sacrificial layer 308 are sequentially formed on the substrate 300. The material of the gate dielectric layer 302 includes an oxide layer formed by thermal oxidation, for example. The gate conductive layer 304 includes a polysilicon layer formed by chemical vapor deposition (CVD), for example. The gate cap layer 306 includes a silicon oxide or silicon oxy-nitride layer formed by chemical vapor deposition, for example. The sacrificial layer 308 includes a material with an etching selectivity different from that of the gate cap layer 306 such as a silicon nitride layer formed by chemical vapor deposition, for example.

The sacrificial layer 308, the gate cap layer 306, the gate conductive layer 304, and the gate dielectric layer 302 are patterned to form a plurality of gate stacked structures 310. The method for forming the gate stacked structures includes photolithography and etching, for example.

Figure 3B:
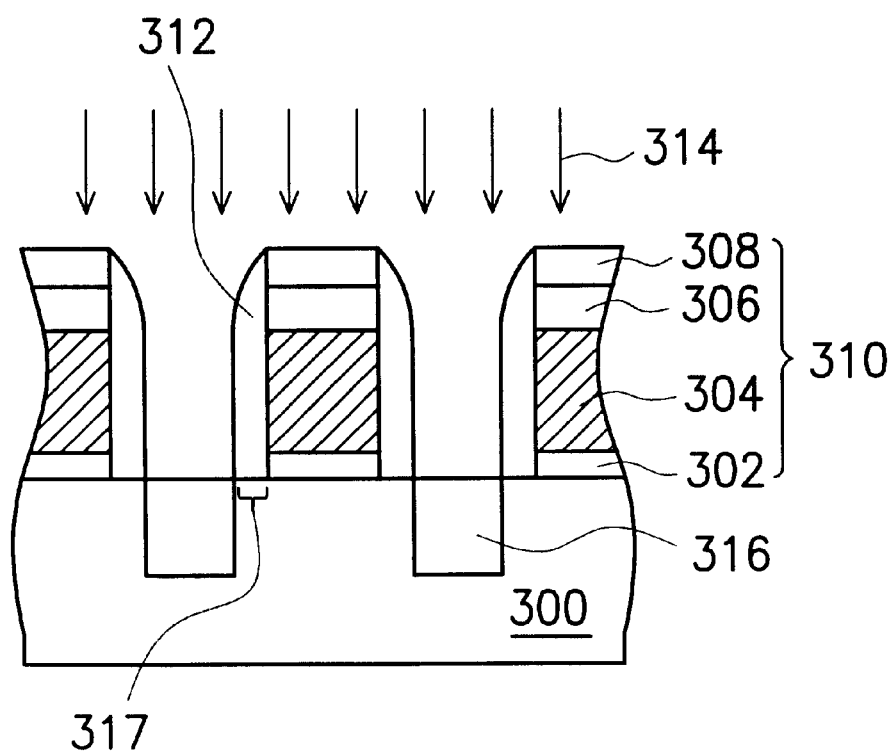

In FIG. 3B, spacers 312 are formed on sidewalls of the gate stacked structures 310. The material of the spacers 312 includes a material with an etching selectivity different from that of the gate cap layer 306 such as a silicon nitride layer. The steps for forming the spacers 312 includes forming a conformal insulation layer on the substrate 300 and removing a part of the insulation layer to leave the spacers 312. The insulation layer can be removed by an anisotropic etching process such as reactive ion etching. As the material of the insulation layer is similar to that of the sacrificial layer 308, a part of the sacrificial layer 308 is removed while removing the insulation layer.

An ion implantation step 314 is performed with the gate stacked structures 310 and the spacers 312 serving as a mask to form source/drain regions 316 in the substrate 300. The source/drain regions 316 are used for bit lines and are not adjacent to the gate stacked structures 310. The ions used for the ion implantation step 314 include N-type or P-type ions. Preferably, arsenic ions that do not easily diffuse are used. After the ion implantation step 314, a step of rapid thermal annealing (RTA) is performed to result in a uniform distribution of the implanted ions. Under the spacers 312, small channel regions are formed as coding areas 317 in the substrate 300 between the source/drain regions 316 and the gate stacked structures 310.

Figure 3C:
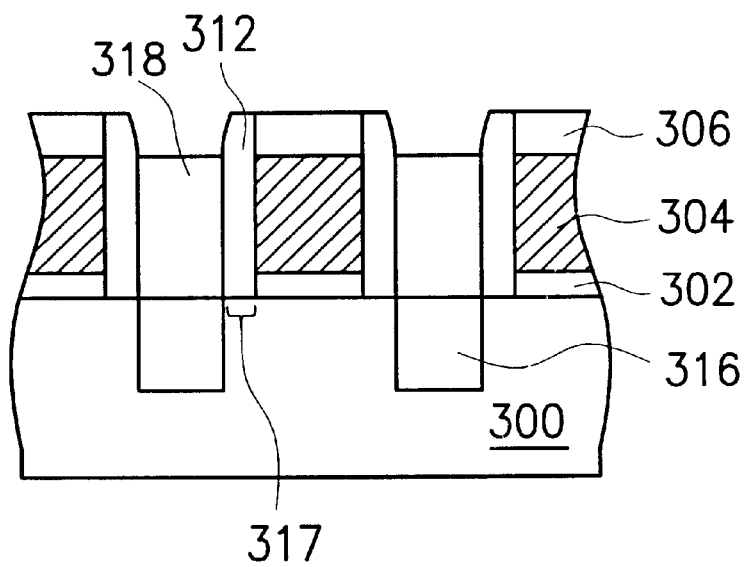

In FIG. 3C, a dielectric layer 318 is formed to fill spaces between the gate stacked structures 310. While selecting the material of the dielectric layer 318, a high etching selectivity is used to avoid removing too much dielectric layer 318 in the step of removing the spacers 312. The material of the dielectric layer 318 is thus adjusted and selected according to the material of the spacers 312. In this embodiment, silicon oxide is used as an example. The method for forming the oxide layer as the dielectric layer 318 includes using tetra ethyl ortho silicate (TEOS)/ozone ($O_3$) as the reactive gas sources for chemical vapor deposition.

A planarization step is performed to remove the sacrificial layer 308, a part of the spacers 312 and a part of the dielectric layer 318 to expose at least a surface of the gate cap layer 306. The planarization step includes chemical mechanical polishing. Alternatively, only a part of the dielectric layer 318 is removed until it has a surface level lower than a surface level of the gate stacked structures 306. The method for removing the dielectric layer 318 includes wet etching using hydrofluoride as an etchant, for example.

Figure 3D:
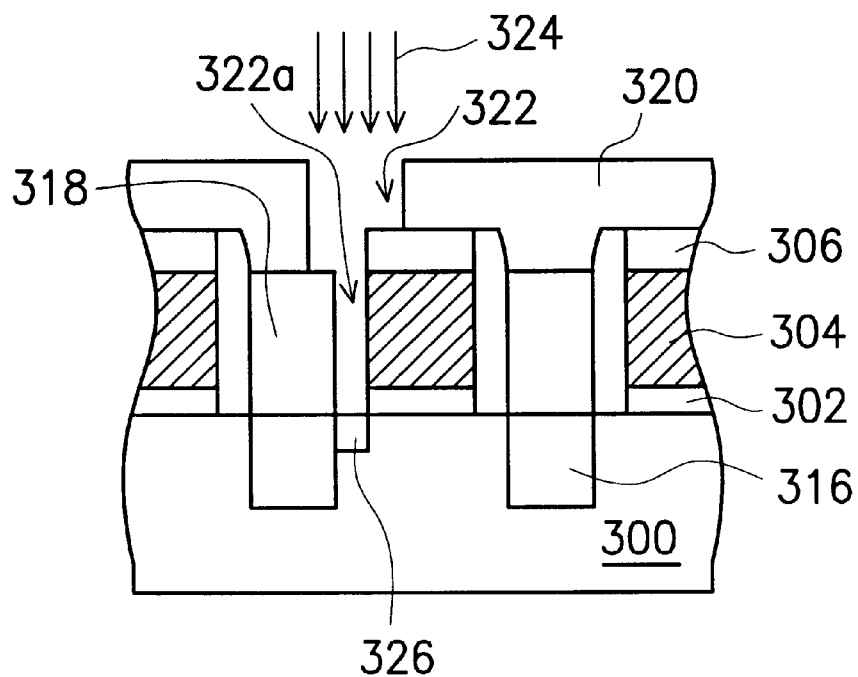

In FIG. 3D, a patterned photoresist layer 320 is formed. The patterned photoresist layer 320 has therein an opening 322 that exposes the spacers 312 and a part of the dielectric layer 318 over at least one of the coding areas 317.

By implanting ions into the coding area 317 between the source/drain regions 316 and the gate conductive layer 304, a programming step is performed. In addition, the pattern of the photoresist layer 320 defines the programming code. The read only memory is encoded using such a predetermined programming code. The method for forming such an opening 322 includes photolithography.

Using the photoresist layer 320 as a mask, the spacer 312 exposed by the opening 322 is removed to form an opening 322a between the dielectric layer 318 and the gate stacked structures 310 to expose the coding area 317. The method for removing the spacers 312 includes wet or dry etching. As the spacers 312 have a high selectivity to the gate cap layer 306 and the dielectric layer 318, excessive removal of the gate cap layer 306 and the dielectric layer 318 is avoided.

Using the photoresist layer 320 as a mask, a step of ion implantation 324 is performed on the coding area 317 exposed by the opening 322a, so that a doped area 326 is formed in the substrate 300 between the source/drain regions 316 and the gate conductive layer 304. That is, by implanting ions into the coding area 317, the programming code is encoded into the memory cell. Therefore, the doped area 326 is a coding implantation block. The ions implanted into the doped area 326 include N-type of P-type ions. Preferably, arsenic ions that do not easily diffuse are used. The implantation energy ranges between about 5 KeV and about 15 KeV, while the implantation dosage is about $1 \times 10^{15}$ $cm^{-2}$ to about $3 \times 10^{15}$ $cm^{-2}$. As the arsenic ions do not easily diffuse, the distribution of the implanted ions is localized in the substrate 300 between the source/drain regions 316 and the gate conductive layer 304 without interfering with the neighboring implantation blocks. In addition, as the ions are implanted into the substrate between the gate conductive layer and the source/drain region directly, the implantation energy can be reduced.

Figure 3E:
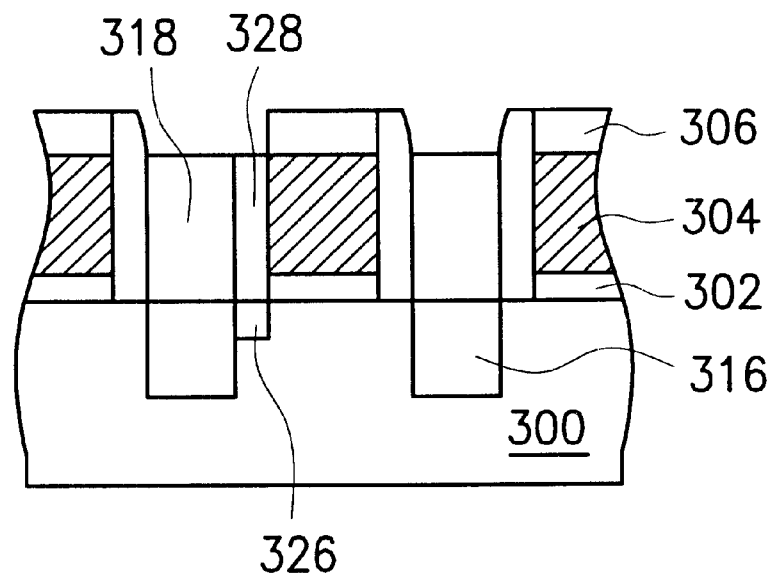

In FIG. 3E, after removing the photoresist layer 320, a dielectric layer 328 is formed to fill the opening 322a. The material of the dielectric layer 328 includes silicon oxide, for example. The method for forming the dielectric layer 328 includes chemical vapor deposition with TEOS/$O_3$ as the reactive gas sources. A planarization step is performed to remove a part of the dielectric layer 328 to at least expose the surface of the gate cap layer 306. The method for removing the dielectric layer 328 includes chemical mechanical polishing, or a wet etching step using hydrofluoride as an etchant.

Figure 3F:
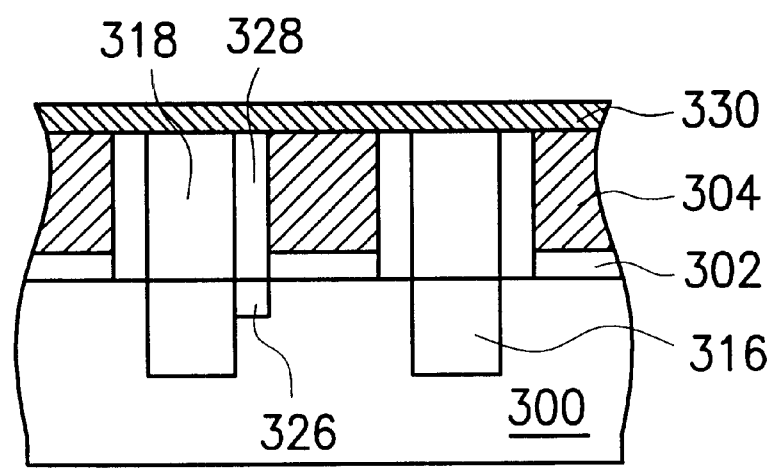

In FIG. 3F, a part of the dielectric layer 328, a part of the dielectric layer 318 and the gate cap layer 306 are removed to at least expose the surface of the gate conductive layer 304. The method for removing these layers includes chemical mechanical polishing or wet etching.

A conductive layer 330 is formed as a word line over the substrate 300. The conductive layer 330 includes a polysilicide layer, for example. The method for forming the polysilicide layer includes forming a polysilicon layer followed by forming a metal silicide layer on the polysilicon layer. The material of the metal silicide layer includes nickel silicide, tungsten silicide, cobalt silicide, titanium silicide, platinum silicide and platinum silicide.

In the above embodiment, each of the gate stacked structures 310 includes to spacers 312. By the spacers 312, a small channel region is formed between the neighboring source/drain region 316 and the gate stacked structure 310. A different dopant is doped into the small channel region to connect or cut off the small channel region for loading data. Thus, two bits of data can be stored in one memory cell. The material of the spacers 312 has a different etching selectivity from the dielectric layer 318 and the gate cap layer 306, so that the misalignment problem can be eliminated. Second embodiment FIG. 4A to FIG. 4F are cross-sectional views showing a first embodiment of the method for fabricating a mask read only memory according to the invention. The cross-sectional views are taken along the cutting line I—I as shown in FIG. 1, while the mask read only memory fabricated according to the invention has a top view similar to FIG. 1.

Figure 4A:
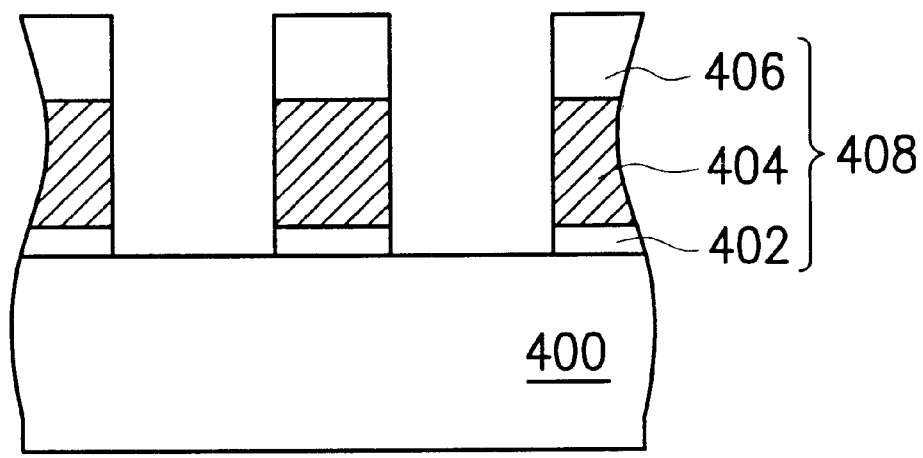
FIGS. 4A to 4F are cross-sectional views along the cutting line I—I line showing a second embodiment of the method for fabricating a mask read only memory.

In FIG. 4A, a substrate 400 is provided. A gate dielectric layer 402, a gate conductive layer 404, and a gate cap layer 406 are formed sequentially on the substrate 400. The material of the gate dielectric layer 402 includes an oxide layer formed by thermal oxidation, for example. The gate conductive layer 404 includes a polysilicon layer formed by chemical vapor deposition (CVD), for example. The gate cap layer 406 includes a silicon oxide or silicon oxy-nitride layer formed by chemical vapor deposition, for example.

The gate cap layer 406, the gate conductive layer 404, and the gate dielectric layer 402 are patterned to form a plurality of gate stacked structures 408. The method for forming the gate stacked structures includes photolithography and etching, for example.

Figure 4B:
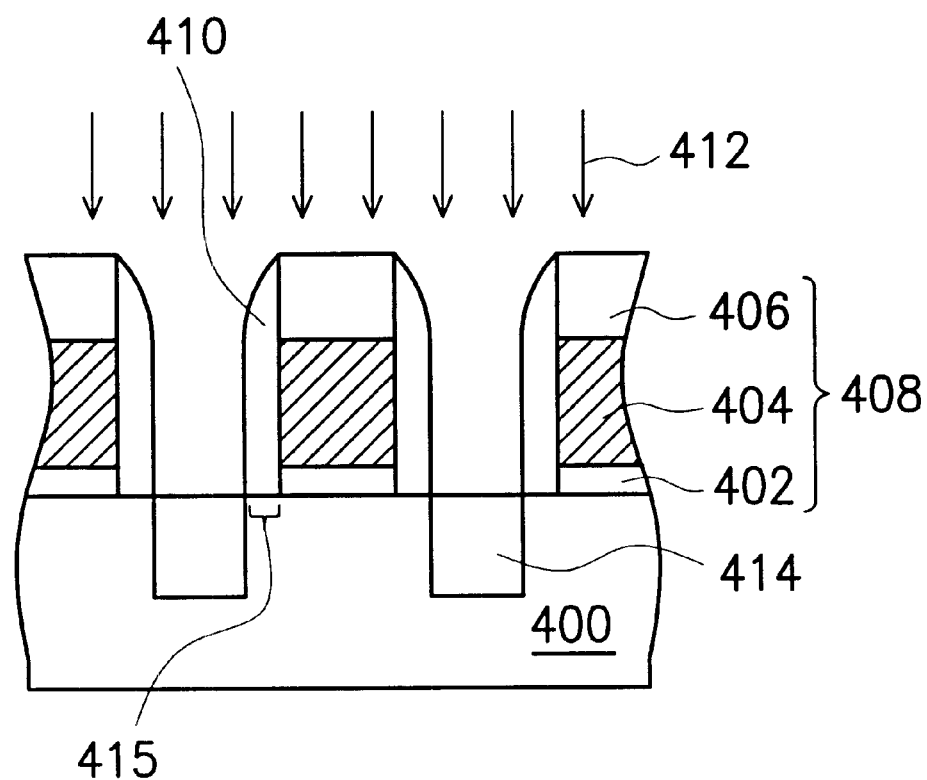

In FIG. 4B, spacers 410 are formed on sidewalls of the gate stacked structures 408. The material of the spacers 410 includes a material with an etching selectivity different from that of the gate cap layer 406 such as a silicon oxide layer. The steps for forming the spacers 410 includes forming a conformal insulation layer on the substrate 400, and removing a part of the insulation layer to leave the spacers 410. The method for forming the insulation layer includes a chemical vapor deposition process using TEOS/$O_3$ as the reactive gas sources. The insulation layer can be removed by an anisotropic etching process such as reactive ion etching.

An ion implantation step 412 is performed with the gate stacked structures 410 and the spacers 410 serving as a mask to form source/drain regions 414 in the substrate 400. The source/drain regions 414 are used for bit lines and are not adjacent to the gate stacked structures 408. The ions used for the ion implantation step 314 include N-type or P-type ions. Preferably, arsenic ions that do not easily diffuse are used. After the ion implantation step 412, a step of rapid thermal annealing (RTA) is performed to result in a uniform distribution of the implanted ions. Under the spacers 312, small channel regions are formed as coding areas 415 in the substrate 400 between the source/drain regions 414 and the gate stacked structures 408.

Figure 4C:
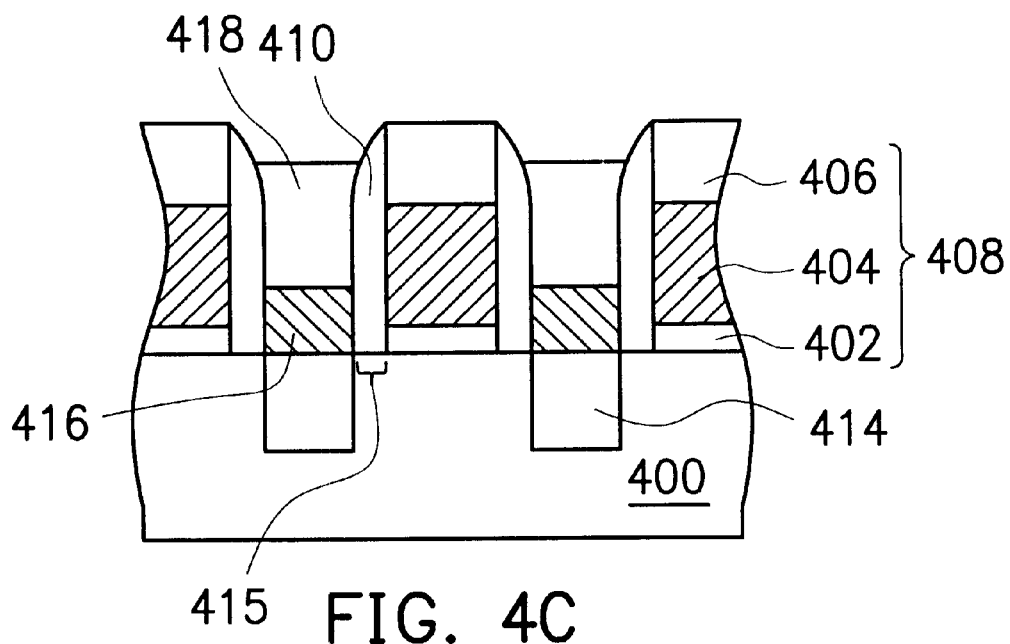

In FIG. 4C, a material layer 416 is formed to fill spaces between the gate stacked structures 408. An etching back process is performed until the surface of the material layer 416 is lower than the surface level of the gate conductive layer 404. While selecting the material of the material layer 416, a high etching selectivity is used to avoid removing too much of the material layer 416 in the step of removing the spacers 410. The material of the dielectric layer 416 is thus adjusted and selected according to the material of the spacers 410. In this embodiment, conductive material such as polysilicon is used as an example. The method for forming the conductive includes chemical vapor deposition. As the material layer 416 includes a conductive layer and is in contact with the source/drain regions 414, the resistance of the source/drain regions 414 is reduced.

A dielectric layer 418 is further formed to fill spaces between the gate stacked structures 408. The material of the dielectric layer 418 includes silicon oxide, for example. The method for forming the silicon oxide layer includes chemical vapor deposition using TEOS/$O_3$ as the gas sources.

A planarization step is performed to remove the dielectric layer 418 to at least expose the surface of the gate cap layer 406. The method for removing the dielectric layer 418 includes chemical mechanical polishing or wet etching using hydrofluoride as an etchant, for example.

Figure 4D:
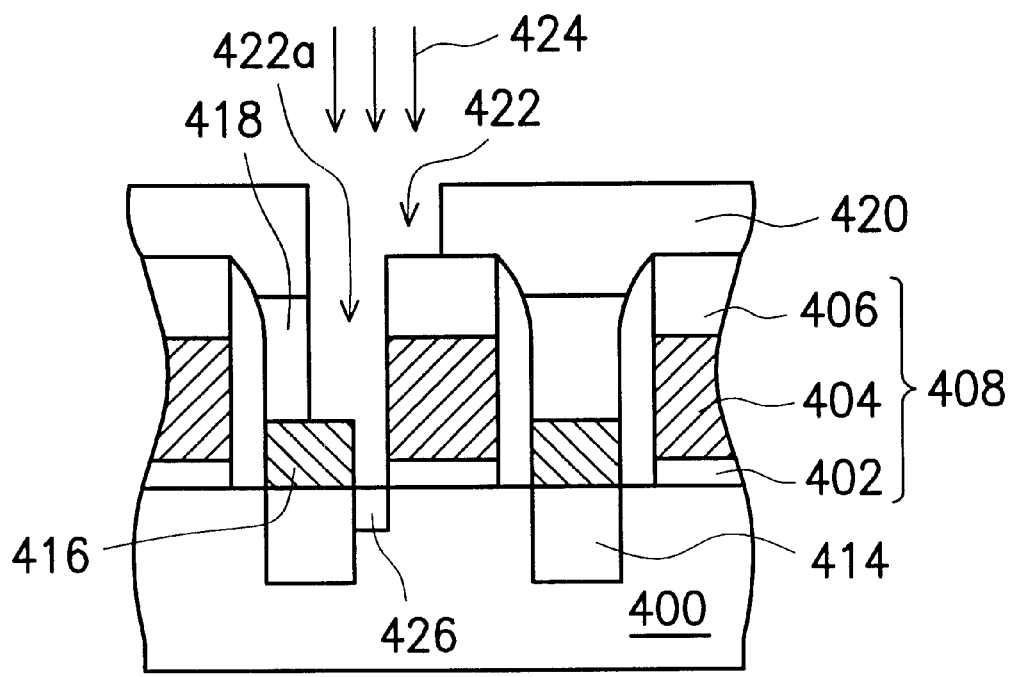

In FIG. 4D, a patterned photoresist layer 420 with an opening 422 that exposes the spacers 410 and a part of the dielectric layer 418 over at least one of the coding areas 415 is formed. That is, the opening 422 exposes at least one of the small channel regions between the source/drain regions 414 and the gate conductive layers 404. By implanting ions into the small channel regions, a programming step is performed. In addition, the pattern of the photoresist layer 420 including the programming code to be encoded is transferred for programming. The method for forming the opening 422 includes photolithography.

Using the photoresist layer 420 as a mask, the spacer 410 and a part of the dielectric layer 418 exposed by the opening 422 are removed to form an implantation opening 422a. The implantation opening 422a exposes a part of the material layer 416, and the coding area 415 between the dielectric layer 418 and the gate stacked structures 408. The method for removing the spacers 410 and the dielectric layer 410 includes wet or dry etching. As the material layer 416 has an etching selectivity different from that of the spacers 410 and the dielectric layer 418, the etching step for removing the dielectric layer 418 and the spacers 410 has an etch stop on the material layer 416.

A step of ion implantation 424 is performed on the coding area 415 exposed by the opening 422a, so that a doped area 426 is formed in the substrate 400 between the source/drain regions 414 and the gate conductive layer 404. That is, by implanting ions into the coding area 415, the programming code is encoded into the memory cell. Therefore, the doped area 426 is a coding implantation block to perform a programming step to encode the programming code into the memory cell. The ions implanted into the doped area 426 include N-type of P-type ions. Preferably, arsenic ions that do not easily diffuse are used. The implantation energy ranges between about 5 KeV and about 15 KeV, while the implantation dosage is about $1\times10^{15}$ cm$^{-2}$ to about $3\times10^{15}$ cm$^{-2}$. As the arsenic ions do not easily diffuse, the distribution of the implanted ions is localized in the substrate 400 between the source/drain regions 414 and the gate conductive layer 404 without interfering with the neighboring implantation blocks. In addition, as the ions are implanted into the substrate between the gate conductive layer 404 and the source/drain region 414 directly, the implantation energy can be reduced.

Figure 4E:
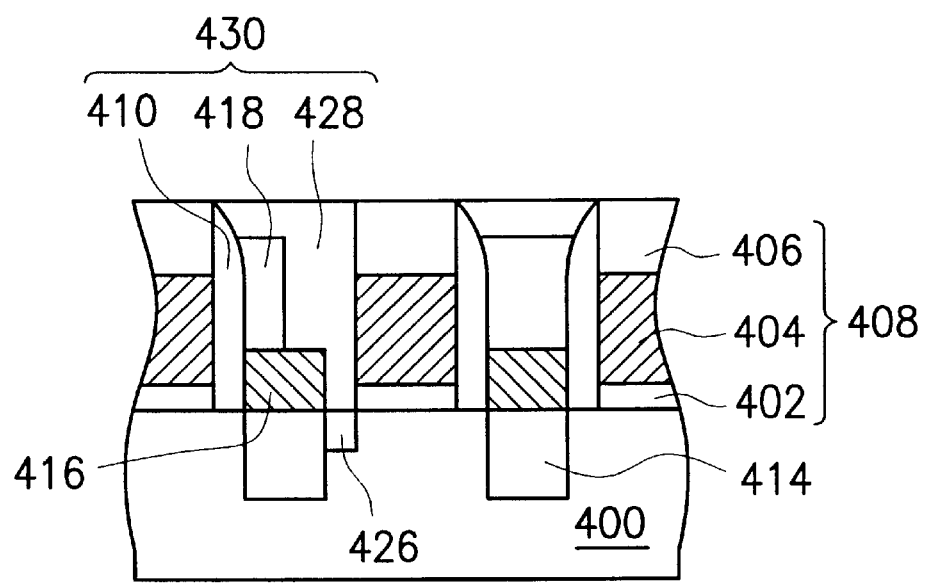

In FIG. 4E, after removing the photoresist layer 420, a dielectric layer 428 is formed to fill the opening 422a. The material of the dielectric layer 428 includes silicon oxide, for example, The method for forming the dielectric layer 428 includes chemical vapor deposition with TEOS/$O_3$ as the reactive gas sources. A planarization step is performed to remove a part of the dielectric layer 428 to expose at least the surface of the gate cap layer 406. The method for removing the dielectric layer 328 includes chemical mechanical polishing or a wet etching step using hydrofluoride as an etchant. The materials of the dielectric layer 428, the dielectric layer 418 and the spacers 410 may be the same as a single dielectric layer 430.

Figure 4F:
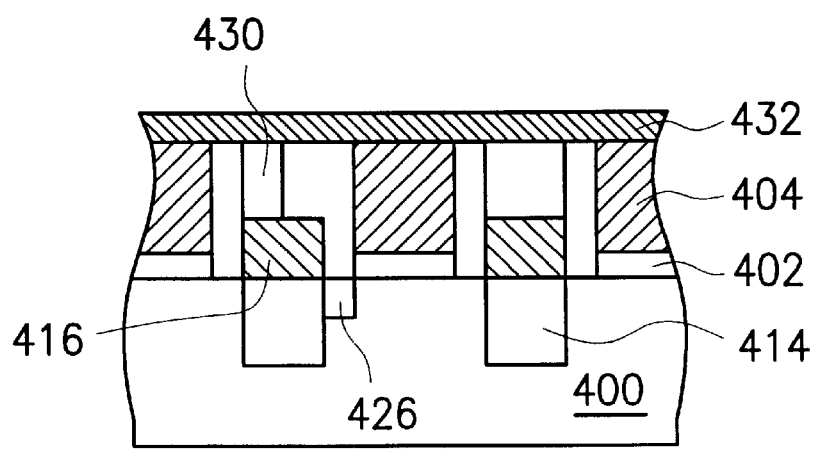

In FIG. 4F, a part of the dielectric layer 430 and the gate cap layer 406 are removed to at least expose the surface of the gate conductive layer 404. The method for removing these layers includes chemical mechanical polishing or wet etching.

A conductive layer 432 is formed as a word line over the substrate 400. The conductive layer 432 includes a polysilicide layer, for example. The method for forming the polysilicide layer includes forming a polysilicon layer followed by forming a metal silicide layer on the polysilicon layer. The material of the metal silicide layer includes nickel silicide, tungsten silicide, cobalt silicide, titanium silicide, platinum silicide and platinum silicide.

In the above embodiment, each of the gate stacked structures 408 includes spacers 410. By the spacers 410, a small channel region is formed between the neighboring source/drain region 414 and the gate stacked structure 408. A different dopant is doped into the small channel region to connect or cut off the small channel region for loading data. Thus, two bits of data can be stored in one memory cell. The material of the spacers 410 and the dielectric layer 418 has an etching selectivity different from that of the material layer 416, so that the misalignment problem can be eliminated.

As discussed in the embodiments, the invention has the following advantages. When spacers are formed on sidewalls of the gate stacked structures, a small channel is formed between two neighboring source/drain region and the gate stacked structure. Using a different dopant, the small channel region is either connected or cut off. Therefore, two bits of data can be stored in one memory unit to enhance the device integration.

A conductive layer is formed on the source/drain regions so that the resistance of the source/drain region is reduced and the device performance is enhanced.

In the step of coding implantation, the ions are directly implanted into the coding area of the substrate between the gate conductive layer and the source/drain regionso that the implantation energy is lowered to avoid the interference caused by ions scattering and diffusion.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a mask read only memory, comprising:
   providing a substrate;
   forming a plurality of gate stacked structures, each of which further comprises a gate dielectric layer, a gate conductive layer and a gate cap layer,
   forming a plurality of source/drain regions in the substrate between the gate stacked structures, wherein the source/drain regions are not adjacent to the gate stacked structures and substrate areas between the source/drain regions and the gate stacked structures are defined as a plurality of coding areas;
   forming a first dielectric layer to fill spaces between the gate stacked structures;
   forming a patterned photoresist layer that comprises a plurality of openings that expose the first dielectric layer over the coding areas;
   removing the exposed dielectric layer to form a plurality of implantation openings that expose the coding areas;
   performing an ion implantation step using the photoresist layer as a mask, so that a plurality of coding implantation blocks are formed in the coding areas;
   removing the photoresist layer;
   forming a second dielectric layer to fill the implantation openings;
   removing a part of the second dielectric layer and the gate cap layer to at least expose the gate conductive layer; and
   forming a word line on the gate conductive layer.

2. The method according to claim 1, wherein ion implantation includes a step of implanting arsenic ions.

3. The method according to claim 2, wherein ion implantation includes using an implantation energy of about 5 KeV to about 15 KeV.

4. The method according to claim 2, wherein ion implantation includes using an implantation dosage ranging from about $1 \times 10^{15}$ $cm^{-2}$ to about $3 \times 10^{15}$ $cm^{-2}$.

5. The method according to claim 1, wherein forming the first dielectric layer to fill the spaces between the gate stacked structures includes:
   forming the first dielectric layer on the substrate and the gate stacked structures; and
   planarizing the first dielectric layer until at least surfaces of the gate stacked structures are exposed.

6. A method of fabricating a mask read only memory, comprising:
   providing a substrate;
   forming a plurality of gate stacked structures, wherein each gate stacked structure further comprises a gate dielectric layer, a gate conductive layer and a gate cap layer;
   forming a plurality of spacers on sidewalls of the gate stacked structures;
   forming a plurality of source/drain regions in the substrate between the gate stacked structures using the gate stacked structures and the spacers as a mask, wherein substrate areas under the spacers between the source/drain regions and the gate stacked structures are defined as a plurality of coding areas;
   forming a first dielectric layer to fill spaces between the gate stacked structures;
   forming a patterned photoresist layer comprising a plurality of openings that expose the spacers over the coding areas;
   removing the exposed spacers to form a plurality of implantation openings that expose the coding areas;
   performing an ion implantation step using the photoresist layer as a mask, so that a plurality of coding implantation blocks are formed in the coding areas;
   removing the photoresist layer;
   forming a second dielectric layer to fill the implantation openings;
   removing a part of the second dielectric layer and the gate cap layer to at least expose the gate conductive layer; and
   forming a word line on the gate conductive layer.

7. The method according to claim 6, wherein ion implantation includes implanting arsenic ions.

8. The method according to claim 7, wherein ion implantation includes using an implantation energy of about 5 KeV to about 15 KeV.

9. The method according to claim 7, wherein ion implantation includes using an implantation dosage ranging from about $1\times10^{15}$ cm$^{-2}$ to about $3\times10^{15}$ cm$^{-2}$.

10. The method according to claim 6, wherein forming the gate conductive layer comprising forming a polysilicon layer.

11. The method according to claim 6, wherein forming the gate cap layer comprising forming a silicon oxy-nitride layer.

12. The method according to claim 6, wherein forming the spacers comprises forming the spacers with a material having an etching selectivity different from that of the gate cap layer.

13. The method according to claim 6, wherein forming the first and the second dielectric layers comprises forming the second dielectric layer with a material having an etching selectivity different from that of the dielectric layer.

14. The method according to claim 6, wherein forming the first and the second dielectric layers comprises forming silicon oxide layers.

15. The method according to claim 6, wherein forming the spacers comprises forming a silicon nitride layers.

16. The method according to claim 7, wherein forming the first dielectric layer to fill the spaces between the gate stacked structures includes:

forming the first dielectric layer on the substrate and the gate stacked structures; and planarizing the first dielectric layer until at least surfaces of the gate stacked structures are exposed.

17. The method according to claim 6, further comprising forming a sacrificial layer on the gate cap layer.

18. A method of fabricating a mask read only memory, comprising:

providing a substrate;

forming a plurality of gate stacked structures, wherein each gate stacked structure further comprises a gate dielectric layer, a gate conductive layer and a gate cap layer;

forming a plurality of spacers on sidewalls of the gate stacked structures;

forming a plurality of bit lines in the substrate between the gate stacked structures using the gate stacked structures and the spacers as a mask, wherein substrate areas under the spacers between the bit lines and the gate stacked structures are defined as a plurality of coding areas;

forming a material layer with a surface level lower than that of the gate conductive layer;

forming a first dielectric layer to fill spaces between the gate stacked structures;

forming a patterned photoresist layer that comprises a plurality of openings that expose the spacers and a part of the first dielectric layer over the coding areas;

removing the exposed spacers and the exposed first dielectric layer to form a plurality of implantation openings that expose the coding areas;

performing an ion implantation step using the photoresist layer as a mask, so that a plurality of coding implantation blocks are formed in the coding areas;

removing the photoresist layer;

forming a second dielectric layer to fill the implantation openings;

removing a part of the second dielectric layer and the gate cap layer to at least expose the gate conductive layer; and forming a word line on the gate conductive layer.

19. The method according to claim 18, wherein ion implantation includes implanting arsenic ions.

20. The method according to claim 19, wherein ion implantation includes using an implantation energy of about 5 KeV to about 15 KeV.

21. The method according to claim 19, wherein ion implantation includes using an implantation dosage ranging from about $1\times10^{15}$ cm$^{-2}$ to about $3\times10^{15}$ cm$^{-2}$.

22. The method according to claim 18, wherein forming the material layer comprising forming a layer with an etching selectivity different from that of the spacers.

23. The method according to claim 18, wherein forming the first and the second dielectric layers comprising forming the second dielectric layer with a material having an etching selectivity different from that of the dielectric layer.

24. The method according to claim 18, where forming the material layer includes forming a conductive layer.

25. The method according to claim 24, wherein forming the conductive layer includes forming a polysilicon layer.

26. The method according to claim 18, wherein forming the first and the second dielectric layers comprises forming silicon oxide layers.

27. The method according to claim 18, wherein forming the spacers comprises forming a silicon nitride layers.

* * * * *